United States Patent
Shrivastava et al.

(10) Patent No.: US 10,014,844 B1
(45) Date of Patent: Jul. 3, 2018

(54) BAND PASS FILTER UTILIZING PARALLEL RESONANCE OF BAW RESONATOR

(71) Applicant: TEXAS INSTRUMENTS INCORPORATED, Dallas, TX (US)

(72) Inventors: Kumar Anurag Shrivastava, Bangalore (IN); Subhashish Mukherjee, Bangalore (IN); Madhulatha Bonu, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/395,353

(22) Filed: Dec. 30, 2016

(51) Int. Cl.
- H04B 1/04 (2006.01)
- H03H 9/54 (2006.01)
- H03H 11/28 (2006.01)
- H03F 3/193 (2006.01)
- H04B 1/40 (2015.01)

(52) U.S. Cl.
CPC .............. *H03H 9/545* (2013.01); *H03F 3/193* (2013.01); *H03H 11/28* (2013.01); *H04B 1/40* (2013.01); *H03F 2200/222* (2013.01); *H03F 2200/294* (2013.01); *H03F 2200/451* (2013.01); *H03F 2200/555* (2013.01)

(58) Field of Classification Search
CPC ........ H04H 9/545; H03F 3/193; H03H 11/28; H04B 1/40
USPC ...................................................... 455/114.3
See application file for complete search history.

(56) References Cited

U.S. PATENT DOCUMENTS

2007/0139117 A1* 6/2007 Iida ..................... H03F 1/223
330/277

\* cited by examiner

*Primary Examiner* — Sanh Phu
(74) *Attorney, Agent, or Firm* — Michael A. Davis, Jr.; Charles A. Brill; Frank D. Cimino

(57) ABSTRACT

A circuit includes an amplifier having an input that receives an alternating current (AC) waveform and an output that is coupled to a power source via a bias resistor. A bulk acoustic wave (BAW) resonator is coupled in parallel to the bias resistor via the power source and the amplifier output. The BAW resonator and the amplifier output forms a band pass filter to filter the AC waveform received at the amplifier input and to provide a filtered AC waveform at the amplifier output.

11 Claims, 3 Drawing Sheets

BAND PASS FILTER UTILIZING PARALLEL RESONANCE OF BAW RESONATOR

TECHNICAL FIELD

This disclosure relates to a filter circuit and more particularly to a band pass filter circuit that employs parallel resonance of a bulk acoustic wave resonator to improve the quality factor of the filter.

BACKGROUND

Filters form an integral part of any wireless transceiver. The filters can be distributed in successive stages of various transceiver architectures such as in baseband (BB), intermediate frequency (IF), and radio frequency (RF) components of the transceiver. The RF filter in a typical receiver (RX) block suppresses the out-of-band (OOB) frequencies/blockers. In the transmitter (TX) block of the transceiver, the RF filter minimizes the OOB emission generated. To achieve such suppression and noise reduction, high quality factor (Q) filters should be selected since high Q performance provides suitable rejection capabilities. This type of performance generally cannot be achieved using on-chip inductor/capacitor (LC) tanks, for example. Typically, an external surface acoustic wave (SAW) filter is used to achieve desired rejection capability. Such SAW-type filters often cannot be integrated on integrated chip implementations however due to the size of the components that constitute the filter.

SUMMARY

This disclosure relates to a band pass filter circuit that employs parallel resonance of a bulk acoustic wave resonator to improve the quality factor of the filter. In one example, a circuit includes an amplifier having an input that receives an alternating current (AC) waveform and an output that is coupled to a power source via a bias resistor. A bulk acoustic wave (BAW) resonator is coupled in parallel to the bias resistor via the power source and the amplifier output. The BAW resonator and the amplifier output forms a band pass filter to filter the AC waveform received at the amplifier input and to provide a filtered AC waveform at the amplifier output.

In another example, a circuit includes at least one amplifier having an input that receives an alternating current (AC) waveform and an output that is coupled to a power source via a bias resistor. A matching impedance network couples the AC waveform to the input of the amplifier. A bulk acoustic wave (BAW) resonator is coupled in parallel to the bias resistor via the power source and the amplifier output. The BAW resonator filters the AC waveform received at the amplifier input and provides an amplified AC waveform that is band pass filtered at the output of the amplifier.

In yet another example, a system includes a transceiver that transmits or receives an alternating current (AC) waveform via one or more transceiver stages. At least one amplifier stage in the transceiver provides filtering of the AC waveform. The amplifier stage includes a low noise amplifier (LNA) transistor device having an input that receives the AC waveform and an output that is coupled to a power source via a bias resistor. A matching impedance network couples the AC waveform to the input of the LNA. A bulk acoustic wave (BAW) resonator is coupled in parallel to the bias resistor via the power source and the LNA output to provide an amplified AC waveform that is band pass filtered at the output of the LNA.

DETAILED DESCRIPTION

This disclosure relates to a band pass filter circuit that employs a parallel resonator to improve the quality factor of the filter. An amplifier circuit such as a low noise amplifier (LNA) can operate in a radio frequency (RF) transceiver system to provide band pass filtering of an RF signal either at an initial stage of the transceiver or at one or more intermediate amplifier stages. The amplifier circuit includes an input that receives an alternating current (AC) waveform (e.g., RF signal) and an output that is coupled to a power source via a bias resistor. For example, if a transistor device is employed as the amplifier, the bias resistor can operate as a pull-up for a drain or collector node of the device (e.g., FET or Bipolar device) to a respective power source for the device. A matching impedance network can also be provided to couple the AC waveform to the input of the amplifier.

A bulk acoustic wave (BAW) resonator can be coupled in parallel to the bias resistor via the power source and the amplifier output. The BAW resonator includes at least two network paths between the amplifier output and the power source. The network paths act as a resonant structure in parallel with the amplifier bias resistor to provide band pass filtering of the AC waveform at the output of the amplifier. In contrast to previous circuits that utilize BAW circuits in series with the AC waveform to provide band pass filtering, the circuits disclosed herein utilizes parallel resonance of the BAW at the output of amplifier stage. By operating the BAW resonator as a parallel circuit at the output of the amplifier as opposed to a series pass circuit, the quality factor of the band pass filter can be substantially improved over series configurations (e.g., about two to four times rejection capability of signals outside the pass band region of the filter).

Figure 1:
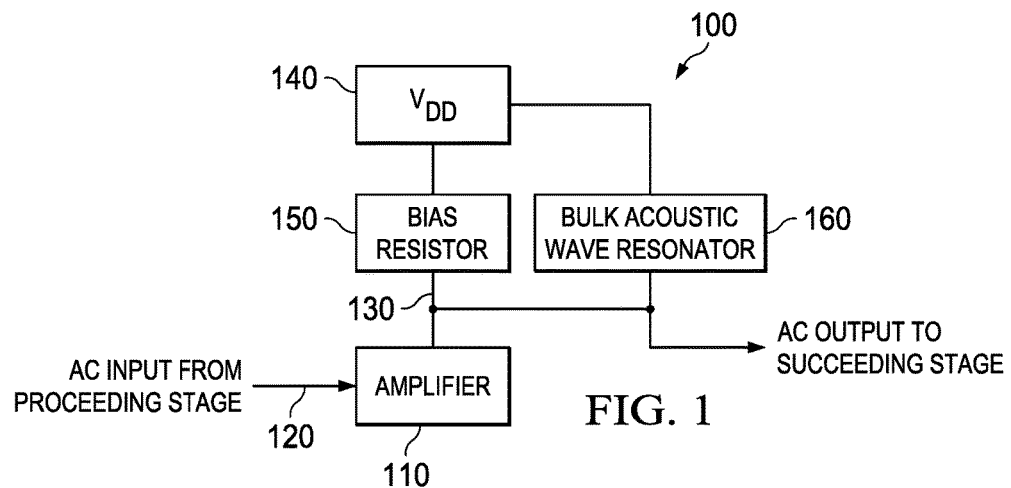
FIG. 1 illustrates an example schematic block diagram of a circuit to provide band pass filtering utilizing parallel resonance of a bulk acoustic wave resonator.

FIG. 1 illustrates an example of a circuit 100 to provide band pass filtering utilizing a parallel resonator. As used herein, the term circuit can include a collection of active and/or passive elements that perform a circuit function such as an analog circuit or control circuit, for example. Additionally or alternatively, the term circuit can include an integrated circuit where all and/or some of the circuit elements are fabricated on a common substrate, for example.

As shown in the example of FIG. 1, the circuit 100 includes an amplifier 110 having an input 120 that receives an alternating current (AC) voltage waveform (e.g., from an antenna or proceeding stage) and an output 130 that is coupled to a power source 140 via a bias resistor 150. A bulk acoustic wave (BAW) resonator 160 is coupled in parallel to the bias resistor 150 via the power source 140 and the amplifier output 130. The BAW resonator 160 and the amplifier output 130 forms a band pass filter to filter the AC waveform received at the amplifier input 120 and provide a filtered AC waveform at the amplifier output 130. The filtered AC waveform at the amplifier output 130 can be passed on to another intermediate stage or to an antenna of a transceiver, for example.

In one example, the amplifier 110 can be a low noise amplifier (LNA) transistor device that receives the AC waveform at the input 120 of the transistor device and provides the filtered AC waveform at the output 130 of the transistor device. As used herein, the term LNA is an amplifier that amplifies a low-power signal without significantly degrading its signal-to-noise ratio (SNR). An amplifier increases the power of both the signal and the noise present at its input. The LNA in contrast can be designed to minimize additional noise. Other noise reduction components can include impedance matching networks and providing low-noise biasing circuits which are illustrated and described below with respect to FIGS. 2 and 4. The LNAs can be employed in radio communications systems, medical instruments, and electronic equipment, for example. A typical LNA may supply a power gain of 100 (20 decibels (dB)) while decreasing the signal-to-noise ratio by less than a factor of two (a 3 dB noise figure (NF)).

The BAW resonator 160 can include at least two network paths between the amplifier output 130 and the power source 140 to provide band pass filtering at the output 130 of the amplifier 110. The BAW resonator 160 is a mechanical device whose electrical characteristics are described via a model depicted in FIG. 3. As will be illustrated and described below with respect to FIG. 5, the circuit 100 can be provided with a transceiver that includes at least one amplifier stage to amplify or filter signals in the transceiver. At least one of the amplifier stages can include the amplifier 110 and BAW resonator 160 described herein. Thus, in some cases, N stages of band pass filters as described herein can be provided by coupling the circuit 100 to the output of a succeeding amplifier/filter stage.

In contrast to other circuits that utilize BAW circuits in series with the AC waveform 120 to provide band pass filtering, the BAW resonator 160 acts as a parallel resonant circuit at the output of the amplifier 110. By operating the BAW resonator 160 as a parallel circuit at the output of the amplifier 110 as opposed to a series pass circuit, the quality factor of the band pass filter can be substantially improved over series configurations (e.g., about two to four times rejection capability of signals outside the pass band region of the filter).

Figure 2:
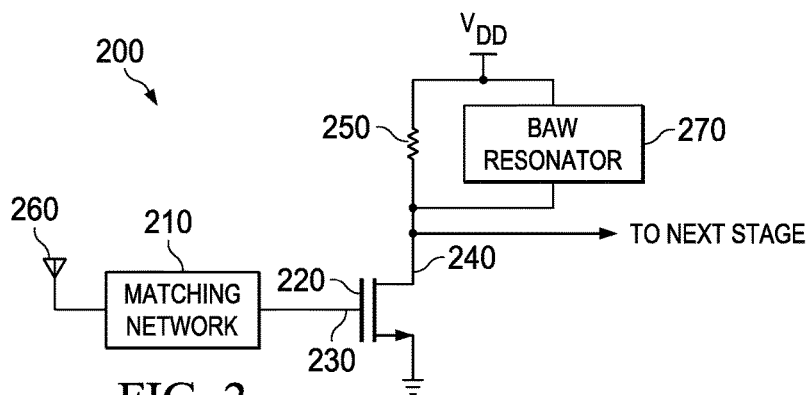
FIG. 2 illustrates an example circuit diagram of a circuit having a matching network to provide band pass filtering utilizing a parallel resonance of a bulk acoustic wave resonator.
Figure 5:
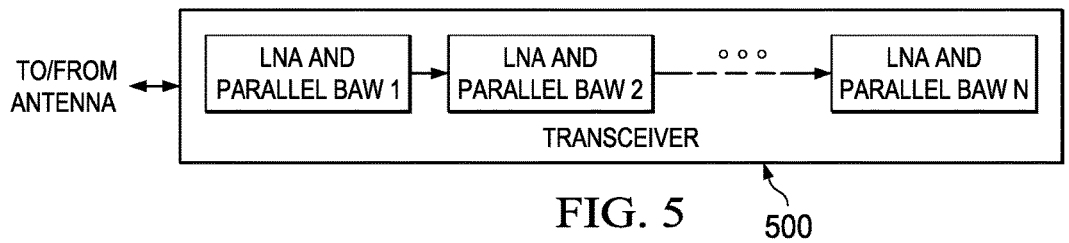
FIG. 5 illustrates an example schematic block diagram of a transceiver having multiple stages to provide band pass filtering utilizing parallel resonance of a bulk acoustic wave resonator.

FIG. 2 illustrates an example circuit 200 having a matching network 210 to provide band pass filtering utilizing a parallel resonator. The circuit 200 includes an amplifier 220 (e.g., FET amplifier) having an input 230 that receives an alternating current (AC) waveform from the matching network 210. The amplifier 220 provides 240 an output that is coupled to a power source VDD via a bias resistor 250 and through a BAW resonator 254. The matching network 210 couples the AC waveform from an antenna 260 in this example to the input 230 of the amplifier 220. In other examples such as shown in the example of FIG. 5, the matching network 210 can couple signal from a proceeding stage to the input 230 of the amplifier 220.

As shown, the BAW resonator 254 can be coupled in parallel to the bias resistor 250 via the power source VDD and the amplifier output 240. As will be illustrated and described below with respect to FIG. 3, the BAW resonator 270 has at least two parallel network paths between the amplifier output 240 and the power source VDD, where the parallel paths form a resonant tank circuit at the output of the amplifier 220. The matching network 210 can include one or more capacitor/inductor series networks to provide matching to the antenna impedance. Also, a bias network can be provided to control the voltage at the input 230 of the amplifier 220 as will be illustrated and described below with respect to FIG. 4.

Figure 3:
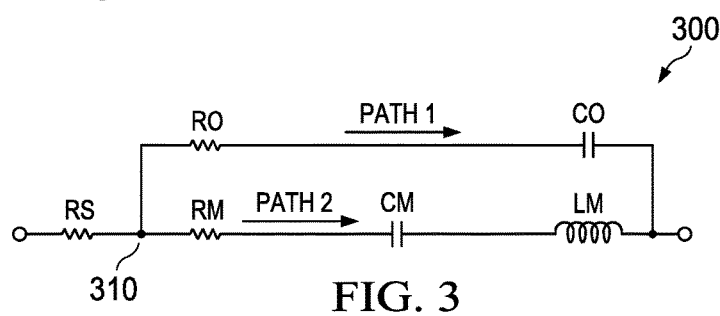
FIG. 3 illustrates an example electrical model of a bulk acoustic wave resonator.

FIG. 3 illustrates an example circuit 300 of a bulk acoustic wave resonator. The circuit 300 represents an approximate electrical model of a BAW resonator which is a mechanical device providing resonant operations for electrical signals. As shown, the BAW resonator circuit 300 includes two parallel network paths shown as path 1 and path 2 which can be connected between the amplifier output and the power source described above with respect to FIGS. 1 and 2 to provide band pass filtering at the output of the amplifier. The network paths of the model can include a first path shown as path 1 having a series resistor RO and capacitor CO, for example. A second path shown as path 2 can include series resistor RM, capacitor CM, and inductor LM. The paths path 1 and path 2 operate as a tank circuit to provide band pass filtering of the input AC waveform at the output of the amplifier described herein.

A series resistor RS is coupled to a common point 310 of the circuit 300. The resistor RS can be provided to limit current when the resonator drives toward low impedance mode based on the respective input frequency applied to the circuit 300. At a peak impedance of about 2.4 GHz for the circuit 300, example circuit values can include RS is about 2.2 ohms, RM is about 0.925 ohms, LM is about 83 nano Henry, CM is about 54 E-15 Farads, RO is about 0.1 ohms, and CO is about 2.2 pico Farads. Various other values and operating frequencies are possible.

Figure 4:
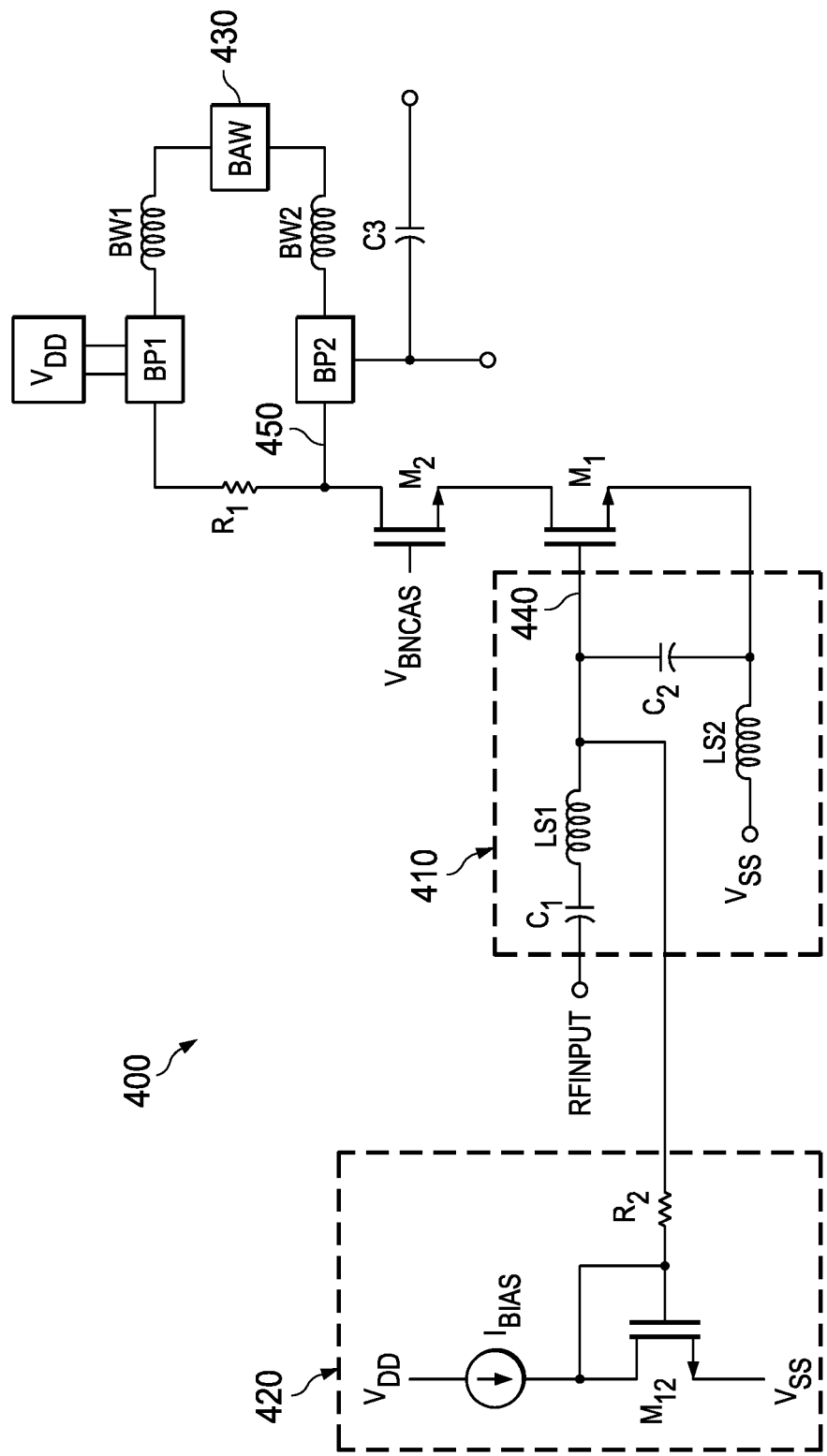
FIG. 4 illustrates an example circuit diagram of a circuit having a matching network and bias circuit to provide band pass filtering utilizing parallel resonance of a bulk acoustic wave resonator.

FIG. 4 illustrates an example circuit 400 having a matching network 410 and bias circuit 420 to provide band pass filtering utilizing a parallel resonator shown as BAW 430. The circuit 400 includes an amplifier M1 having an input 440 that receives an alternating current (AC) waveform and an output 450 that is coupled to a power source VDD via a bias resistor R1. The bulk acoustic wave (BAW) resonator 430 is coupled in parallel to the bias resistor R1 via integrated circuit bonding inductances modeled as LBW1 and LBW2. The BAW resonator 430 and the amplifier output 450 from M1 forms a band pass filter to filter the AC waveform received at the amplifier input 440 and provides a filtered AC waveform at the amplifier output of M1.

In one example, the amplifier M1 can be a low noise amplifier (LNA) transistor device that receives the AC waveform at the input 440 of the transistor device and provides the filtered AC waveform at the output 450 of the transistor device. A second transistor M2 can be provided that is in series with the LNA transistor device M1. The transistor M2 provides a control to the AC waveform at the output 450 based on a predetermined threshold voltage VBNCAS applied to an input of the transistor M2.

The matching impedance network 410 matches an impedance of an antenna to the input of the transistor device M1. The matching impedance network 410 includes a first series capacitor C1 and inductor LS1 forming a pair to couple the RF signal to the input 440 of the transistor device M1. The matching impedance network 410 can also include a second series capacitor C2 and inductor LS2 forming a pair that is coupled between a ground potential and the input of the transistor device M1. The bias network 420 can be provided to control a bias voltage at the input 440 of the transistor device M2. The bias network 420 can include a transistor device M12 that is driven from a current source IBIAS to control the bias voltage at 440. A series resistor R2 can be provided to couple the bias network to the input 440 of M1. An output capacitor C3 can be provided to couple band pass filtered signals to subsequent transceiver stages.

FIG. 5 illustrates an example of a transceiver 500 having multiple stages to provide band pass filtering utilizing a parallel resonator. In this example, one or more LNA and parallel BAW stages 1 though N can be provided to provide band pass filtering as described herein, where N is a positive integer. In some cases, stages may be ganged in series where one stage feeds a subsequent stage. In other transceiver examples, the LNA and parallel BAW stages may be dispersed throughout the transceiver 500. For example, a respective LNA and BAW stage may be driven from an intermediate frequency (IF) stage and provide output to another IF stage of the transceiver 500.

Figure 6:
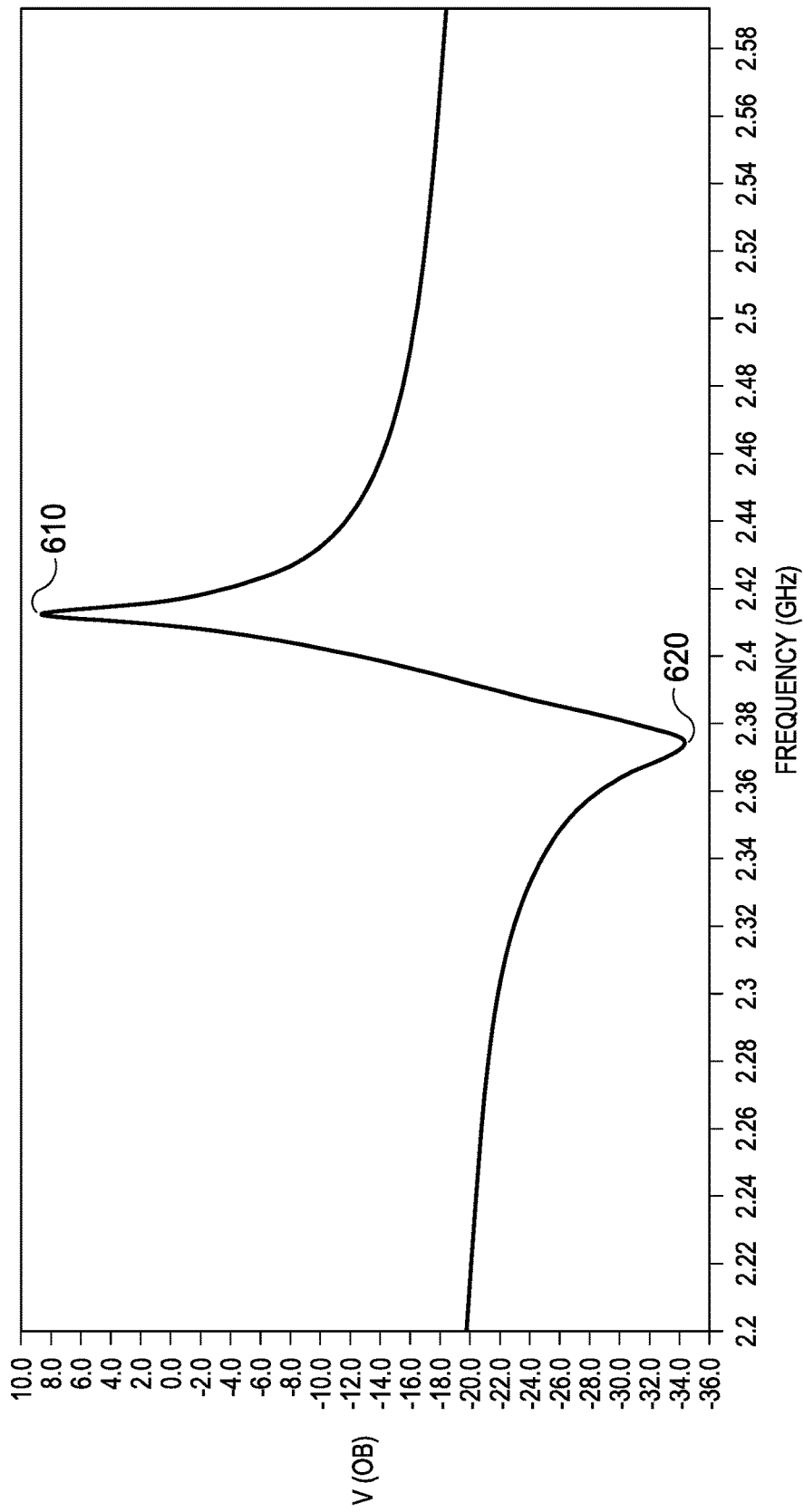
FIG. 6 illustrates an example signal diagram that illustrates AC response for a band pass filter utilizing parallel resonance of a bulk acoustic wave resonator.

FIG. 6 illustrates an example signal diagram 600 that illustrates band pass filter characteristics for a band pass filter utilizing parallel resonance of a BAW resonator. In this example, the BAW resonator as described herein has its maximum impedance at about 2.4 GHz shown at 610 although other frequencies can similarly be supported by selecting a BAW resonator having different resistor, capacitor, and/or inductor values of the BAW resonator such as illustrated and described above with respect to FIG. 3. In this example, the band pass filters described herein utilizing a BAW resonator at an output of an amplifier provide a quality factor of about four times or more from that of a series filter configuration. The signal shown at 610 provides a sharp filter response over the response depicted at 620. By utilizing the parallel BAW as described herein, the sharp response of 610 can be utilized to provide band pass filtering as described herein at the output of the associated amplifier. This provides a much improved quality factor (Q) over series BAW implementations (e.g., from about two to four times Q factor).

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit, comprising:
   a low noise amplifier (LNA) transistor device having: an input coupled to receive an alternating current (AC) waveform; and an output coupled through a bias resistor to a power source;
   a bulk acoustic wave (BAW) resonator coupled in parallel to the bias resistor between the power source and the LNA transistor device output, the BAW resonator and the LNA transistor device forming a band pass filter to filter the AC waveform received at the LNA transistor device input and to provide the filtered AC waveform at the LNA transistor device output; and
   a bias network to control a bias voltage at the LNA transistor device input, the bias network including a second transistor device coupled to be driven from a current source to control the bias voltage.

2. The circuit of claim 1, further comprising a third transistor device, coupled in series with the LNA transistor device, to couple the LNA transistor device output to the BAW resonator.

3. The circuit of claim 2, wherein the third transistor device has an input coupled to receive a predetermined threshold voltage to control current received by the third transistor device from the LNA transistor device.

4. The circuit of claim 2, further comprising a matching impedance network to match an impedance of an incoming radio frequency (RF) signal to the LNA transistor device input.

5. The circuit of claim 1, wherein the BAW resonator includes at least two network paths between the LNA transistor device output and the power source to provide band pass filtering at the LNA transistor device output.

6. The circuit of claim 1, further comprising a transceiver that includes at least one amplifier stage to amplify or filter signals in the transceiver, wherein the amplifier stage includes the LNA transistor device and the BAW resonator.

7. A circuit, comprising:
   at least one low noise amplifier (LNA) transistor device having: an input coupled to receive an alternating current (AC) waveform; and an output coupled through a bias resistor to a power source;
   a matching impedance network to couple the AC waveform to the LNA transistor device input;
   a bulk acoustic wave (BAW) resonator, coupled in parallel to the bias resistor between the power source and the LNA transistor device output, to filter the AC waveform received at the LNA transistor device input and to provide an amplified AC waveform that is band pass filtered at the LNA transistor device output;
   a second transistor device, coupled in series with the LNA transistor device, to couple the LNA transistor device output to the BAW resonator; and
   a bias network to control a bias voltage at the LNA transistor device input, the bias network including a third transistor device coupled to be driven from a current source to control the bias voltage.

8. The circuit of claim 7, wherein the second transistor device has an input coupled to receive a predetermined threshold voltage to control current received by the second transistor device from the LNA transistor device.

9. The circuit of claim 7, wherein the BAW resonator includes at least two network paths between the LNA transistor device output and the power source to provide band pass filtering at the LNA transistor device output.

10. The circuit of claim 7, further comprising a transceiver that includes at least one amplifier stage to amplify or filter signals in the transceiver, wherein the amplifier stage includes the LNA transistor device and the BAW resonator.

11. A system, comprising:
   a transceiver to transmit or receive an alternating current (AC) waveform via one or more transceiver stages, the transceiver including at least one amplifier stage to filter the AC waveform, and the at least one amplifier stage including:

a low noise amplifier (LNA) transistor device having:
an input coupled to receive the AC waveform; and an output coupled through a bias resistor to a power source;
a matching impedance network to couple the AC waveform to the LNA transistor device input; and
a bulk acoustic wave (BAW) resonator, coupled in parallel to the bias resistor between the power source and the LNA transistor device output, to provide an amplified AC waveform that is band pass filtered at the LNA transistor device output; and
a bias network to control a bias voltage at the LNA transistor device input, the bias network including a second transistor device coupled to be driven from a current source to control the bias voltage.

* * * * *